United States Patent Office 3,649,369

Patented Mar. 14, 1972

3,649,369

METHOD FOR MAKING N-TYPE LAYERS IN GALLIUM ARSENIDE AT ROOM TEMPERATURES

Robert G. Hunsperger, Malibu, and Ogden J. Marsh, Woodland Hills, Calif., assignors to Hughes Aircraft Company, Culver City, Calif.

No Drawing. Filed Mar. 9, 1970, Ser. No. 17,956
Int. Cl. H01l 7/54
U.S. Cl. 148—1.5 4 Claims

ABSTRACT OF THE DISCLOSURE

A method for making an N-type layer in a gallium arsenide substrate is described. Sulphur ions are implanted into the gallium arsenide substrate at room temperature. A sheet resistance in the range $10^3$ to $10^5$ ohms per square may be achieved by implanting a dose of between $10^{14}$ and $10^{16}$ sulphur ions per cm.$^2$.

This invention relates to ion implanation of semiconductors in general, and in particular to the formation of N-type layers in gallium arsenide by ion implantation at room temperatures. The invention described herein was made in the performance of work under a NASA contract and is subject to the provisions of Section 305 of the National Aeronautics and Space Act of 1958, Public Law 85-568 (72 Stat. 435; 42 U.S.C. 2457).

It is well known in the art to form an N-type layer in a gallium arsenide substrate. Conventionally, the substrate is doped with impurities of a desired N-type conductivity determining element at temperatures of at least 300° C. and usually higher than 500° C. The doping technique employed is either diffusion or alloying.

One disadvantage of forming N-type layers in gallium arsenide at the aforementioned temperatures is that P-type contaminants present on the substrate surface may be diffused into the substrate, thereby doping the substrate in the opposite way from that desired. Moreover, since gallium arsenide decomposes at a temperature of 650° C., special precautions must be taken to prevent decomposition when the doping temperatures approach this level. For example, the gallium arsenide substrate is usually coated with an oxide of silicon or is confined within a sealed glass tube containing arsenic prior to heating to doping temperatures. In addition, when N-type gallium arsenide layers are formed at the aforementioned temperatures, layer defects become annealed out of the substrate, causing the layer to have a lower sheet resistance than that desired for certain applications. For example, in monolithic integrated circuits sheet resistances of essentially $10^3$ to $10^5$ ohms per square over short resistor path lengths are useful.

In the past, is was not known how to form N-type layers in gallium arsenide at room temperatures (essentially from 15° C. to 35° C.). Numerous N-type conductivity determining dopant materials had been tried in attempts to create N-type layers in gallium arsenide (as well as in other semiconductor substrates) at room temperatures but to no avail.

When forming an N-type layer in gallium arsenide, which is a Group III–V compound (gallium is from Group III and arsenic is from Group V of the Periodic Tables of Elements), impurities from Group VI–A are generally chosen as the dopants. Group VI–A atoms become substituted for some of the Group V atoms. Since Group VI–A atoms each have one more valence electron than Group V atoms, the Group VI–A atoms become donors and establish the resulting layer as N-type.

The most frequently used Group VI–A dopants are selenium and tellurium. Since attempts to form N-type layers in gallium arsenide by doping with selenium or tellurium at room temperatures were unsuccessful, it was believed that N-type layers could not be formed in gallium arsenide at room temperatures with any other Group VI–A dopant, such as sulphur, for example, especially since as a dopant sulphur behaves in a manner similar to selenium and tellurium at temperatures above 300° C.

Accordingly, it is an object of the present invention to provide a method for forming N-type layers in gallium arsenide at temperatures significantly lower than had been believed usable.

It is a further object of the invention to provide a method for forming N-type layers in gallium arsenide at room temperatures, thereby not only simplifying the doping operations but also eliminating undesired side effects which resulted from prior art doping techniques.

It is still another object of the present invention to provide a method for forming in a gallium arsenide substrate an N-type layer having a carefully controlled sheet resistance in the range of essentially $10^3$ to $10^5$ ohms per square.

In accordance with the method of the invention, a preselected dose of sulphur ions is implanted into a gallium arsenide substrate at a temperature below essentially 200° C., and preferably in the range essentially between 15° C. and 35° C. A sheet resistance of essentially between $10^3$ and $10^5$ ohms per square may be achieved when the preselected dose is essentially between $10^{14}$ and $10^{16}$ ions per cm.$^2$.

Additional objects, advantages and characteristic features of the invention will be apparent from consideration of the following detailed description of an exemplary manner in which the method of the invention may be carried out.

Before performing an ion implanation operation in accordance with the invention, it is desirable to clean and polish the surface of the gallium arsenide substrate in which the N-type layer is to be formed in order to enhance the uniformity of thickness of the N-type layer and minimize possible residual damage in the gallium arsenide crystal lattice. The cleaning may be accomplished by etch-polishing the gallium arsenide substrate in a solution of methyl alcohol and bromine. A specific exemplary solution of 10% bromine and 90% methyl alcohol may be used for about three minutes, although other proportions of bromine and methyl alcohol are suitable, the etching time being longer for smaller concentrations of bromine.

In the ion implanation operation, a preselected dose of sulphur ions is implanted into the gallium arsenide substrate at a temperature below essentially 200° C., and preferably at room temperature (essentially from 15° C. to 35° C.). Since the dosage of implanted sulphur ions affects the sheet resistance of the resultant N-type layer, the particular dosage used is selected in accordance with the desired sheet resistance and in the manner explained more fully below. Preferably, the sulphur ions are implanted at an energy of essentially between 30 and 300 kev.

When it is desired that the resultant N-type layer have a sheet resistance of essentially $10^3$ to $10^5$ ohms per square, the sulphur ion dosage should be between essentially $10^{14}$ and $10^{16}$ ions per cm.$^2$. The sheet resistance is inversely proportional to the product of the number of charge carriers and the charge carrier mobility. When the dosage is less than approximately $10^{14}$ ions per cm.$^2$, the number of charge carriers is proportional to the dosage, and also an insufficient number of sulphur ions will be present in the gallium arsenide substrate to provide a sheet resistance below essentially $10^5$ ohms per square. Moreover, the carrier mobility will decrease as the dosage is increased but at a rate slower than that at which the number of charge carriers will increase; thus, the sheet resistance will decrease as the dosage is increased. When the sulphur ion dosage exceeds approximately $10^{14}$ ions per $cm.^2$, the number of charge carriers will increase more slowly as a function of increasing dosage, while the mobility will continue to decrease at relatively the same rate; thus, the resultant sheet resistance will decrease more slowly. When the dosage is at a value between approximately $10^{14}$ and $10^{15}$ ions per $cm.^2$, a sheet resistance approaching $10^3$ ohms per square is achieved. When the ion dosage is increased beyond this value, the number of charge carriers will increase more slowly than the carrier mobility will decrease with the result that the sheet resistance increases, reaching a value of approximately $10^5$ ohms per square for an ion dosage of essentially $10^{16}$ ions per $cm.^2$.

Although a specific method for forming an N-type layer in a gallium arsenide substrate has been described in detail, variations may be made therein within the spirit, scope and contemplation of the invention.

What is claimed is:

1. A method for forming an N-type layer in a gallium arsenide substrate comprising implanting a preselected dose of sulphur ions into said substrate at a temperature below essentially 200° C.

2. The method claimed in claim 1 wherein said temperature is essentially between 15° C. and 35° C.

3. The method claimed in claim 1 wherein said preselected dose is essentially between $10^{14}$ and $10^{16}$ sulphur ions per $cm.^2$.

4. The method claimed in claim 1 wherein said sulphur ions are implanted at an energy of essentially between 30 and 300 kev.

References Cited

UNITED STATES PATENTS 3,515,956 6/1970 Martin et al. ---------- 148—1.5

OTHER REFERENCES

Kellett et al., Ion Physics Corp., AFCRL–66–367, pp. iii, 81 & 83, July 1966.

L. DEWAYNE RUTLEDGE, Primary Examiner

J. M. DAVIS, Assistant Examiner

U.S. Cl. X.R.

252—62.3 GA